(12) United States Patent
Shahsavari

(10) Patent No.: US 9,712,199 B2
(45) Date of Patent: Jul. 18, 2017

(54) RECEIVER WITH AN AMPLIFIER LINEARIZER

(71) Applicant: TELEFONAKTIEBOLAGET L M ERICSSON (PUBL), Stockholm (SE)

(72) Inventor: Sima Shahsavari, Mölndal (SE)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 0 days.

(21) Appl. No.: 14/913,459

(22) PCT Filed: Sep. 6, 2013

(86) PCT No.: PCT/EP2013/068477
§ 371 (c)(1),
(2) Date: Feb. 22, 2016

(87) PCT Pub. No.: WO2015/032438
PCT Pub. Date: Mar. 12, 2015

(65) Prior Publication Data
US 2016/0218761 A1    Jul. 28, 2016

(51) Int. Cl.
H04B 1/16       (2006.01)
H04B 1/10       (2006.01)
H03F 1/32       (2006.01)

(52) U.S. Cl.
CPC .......... *H04B 1/16* (2013.01); *H03F 1/32* (2013.01); *H03F 1/3247* (2013.01); *H04B 1/1027* (2013.01); *H03F 2201/3212* (2013.01)

(58) Field of Classification Search
CPC  H04B 1/16; H04B 1/1027; H03F 1/32; H03F 1/3247; H04L 25/0292; H04L 27/38
(Continued)

(56) References Cited

U.S. PATENT DOCUMENTS 4,446,464 A * 5/1984 LeGrand ............ G01S 1/48
                                            342/399
7,242,725 B2 * 7/2007 Matsumoto ........ H04L 27/38
                                            375/254
(Continued)

OTHER PUBLICATIONS

Durney, et al. CDF Estimation for 1.2 Pre-distortion of Non-linear High Power Amplifiers. 2002 IEEE International Conference on Acoustics, Speech and Signal Processing. Proceedings (CASSP). Orlando. FL. May 13-17, 2002; [IEEE International Conference on Acoustics, Speech and Signal Processing (ICASSP)]. New York. NY. IEEE May 13, 2002 (May 13, 2002).

(Continued)

*Primary Examiner* — Betsy Deppe

(57) ABSTRACT

A receiver for signals. The receiver comprises, an amplifier arranged to receive and amplify the signals received by the receiver. The receiver also comprises a linearizer arranged to linearize the amplitude value of the output signals from the amplifier. In the receiver, the linearizer is arranged to perform the linearizing by means of determining actual and desired values of a statistical function for the amplitude values of the output signals from the amplifier and to replace the amplitude values of the output signals from the amplifier with amplitude values which have the same desired values of the statistical function. In embodiments of the receiver, the statistical function is the cumulative distribution function.

6 Claims, 7 Drawing Sheets

(58) Field of Classification Search
USPC .................................. 375/316, 285; 455/130
See application file for complete search history.

(56) References Cited

U.S. PATENT DOCUMENTS

| 7,627,060 B2* | 12/2009 | Taylor | H03F 1/32 |
| | | | 375/324 |
| 2005/0219089 A1* | 10/2005 | Batruni | H03F 1/32 |
| | | | 341/118 |

OTHER PUBLICATIONS

Huang, et al. Nonlinear Compensation of High Power Amplifier Distortion for Communication Using a Histogram-Based Method. IEEE Transactions on Signal Processing. vol. 54. No. 11. Nov. 1, 2006 (Nov. 1, 2006).

Characterizing Digitally Modulated. Signals with CCDF Curves Jan. 1, 2000 (Jan. 1, 2000). Retrieved from the Internet: URL:http://www.emce.tuwien.ac.at/hfadmin/354059/download/Characterizing Digitally Modulated Signals width CCDF Curves AgilentApplication Note 5968-6875E .pdf.

* cited by examiner

RECEIVER WITH AN AMPLIFIER LINEARIZER

TECHNICAL FIELD

The present invention discloses a receiver with a linearizer for an amplifier.

BACKGROUND

Amplifiers are essential components in a wide variety of systems, e.g. electronics systems, such as, for example, communications systems, radar systems, TV systems, etc. Amplifiers can however also be used in a variety of systems other than electronics systems, e.g. acoustics, optics etc.

When amplifiers are used in communications systems, increasing demands for higher data rates and greater bandwidths impose severe challenges for designing highly efficient amplifiers in order to avoid amplifiers which exhibit inherent non-linearities in their transfer functions. Nonlinearities in amplifiers in communications systems introduce at least two problems: spectral growth beyond the signal bandwidth, which interferes with adjacent channels, and distortion within the allocated bandwidth, which results in increased bit error rates.

In order to linearize transmitter amplifiers, Digital Signal Processing, DSP, techniques are often employed to compensate for nonlinear distortions and to achieve highly efficient and reasonably linear amplifiers. Among others, digital pre-distortion, DPD, is a cost effective technique which is widely used in transmitters to provide a linear signal at the output of transmitter PAs.

Usually, in communications systems, efforts to correct for amplifier non-linearities, i.e. to "linearize" amplifiers, have taken place in transmitters, whereas efforts to linearize amplifiers in receivers have been less common.

Naturally, receiver amplifiers could conceivably be linearized by means of techniques similar to those used in transmitter amplifiers, e.g. DPD, but this would, however, require the distorted signal after the post-distorter to be compared with a reference signal before the amplifier, thereby necessitating complex implementations including, inter alia, analogue to digital conversion, compensation for gain imbalances, compensation for DC offsets, power adjustment. Using post-distortion in order to linearize a receiver amplifier would also pose stringent requirements on time alignment in the comparisons.

SUMMARY

It is an object to obviate at least some of the above disadvantages and provide a receiver with an amplifier with improved linearization.

This object is achieved by means of a receiver for signals. The receiver comprises an amplifier which is arranged to receive and amplify the signals received by the receiver, and the receiver also comprises a linearizer which is arranged to linearize the amplitude value of the output signals from the amplifier.

In the receiver, the linearizer is arranged to perform its linearizing by means of determining actual and desired values of a statistical function for the amplitude values of the output signals from the amplifier and to replace the amplitude values of the output signals from the amplifier with amplitude values which have the same desired values of the statistical function.

Since a statistical function of the amplitude values of the output signals from the amplifier is used, knowledge of the transfer function of the amplifier is not necessary, and the use of a model of the function of the amplifier is obviated.

In embodiments of the receiver, the statistical function is the cumulative distribution function.

In embodiments of the receiver, the signals are modulated, and the receiver is arranged to determine the desired statistical function by means of knowing which modulation type that has been applied to the received signals.

In embodiments of the receiver, the replacement of the amplitude values of the output signals from the amplifier is performed by means of a polynomial function.

In embodiments, the receiver further comprises a de-mapper unit for the output values from the amplifier, and the receiver is arranged to measure the bit error rate, BER, of the output values from the de-mapper unit, and to correct the phase of the output values from the amplifier if the BER falls below a predetermined threshold. The receiver is arranged to perform the phase correction by means of compensating for the phase error of the output values from the amplifier by using the polynomial $\phi(n) = \sum_{k=1}^{2} \beta_k |x_{out\_lin}(n)|^k$, where $\phi(n)$ is the phase error at the output of the amplifier, $x_{out\_lin}$ is the linearized amplitude corresponding to the signal at the input to the amplifier at time instant n, and $\beta_k$ is a weighting coefficient.

In some such embodiments, the coefficients $\beta_k$ at time instant l are found by:

$$\begin{bmatrix} \beta_1(l) \\ \beta_2(l) \end{bmatrix} = \begin{bmatrix} \beta_1(l-1) \\ \beta_2(l-1) \end{bmatrix} + \mu \cdot \phi(e(l)) \cdot \begin{bmatrix} x_{in}(l) \\ x_{in}^{(2)}(l) \end{bmatrix},$$

where e(l) is the complex symbol error corresponding to the output values from the amplifier when they reach the de-mapper unit and are de-mapped to a symbol at time instant l, $\phi$ is the phase of e(l) and represents the phase error in the de-mapper unit at time instant l, μ is a step size ranging from 0 to 1, and $x_{in}$ (l) is the input signal to the de-mapper unit at time instant l.

BRIEF DESCRIPTION OF THE DRAWINGS

The invention will be described in more detail in the following, with reference to the appended drawings, in which.

DETAILED DESCRIPTION

Figure 1:
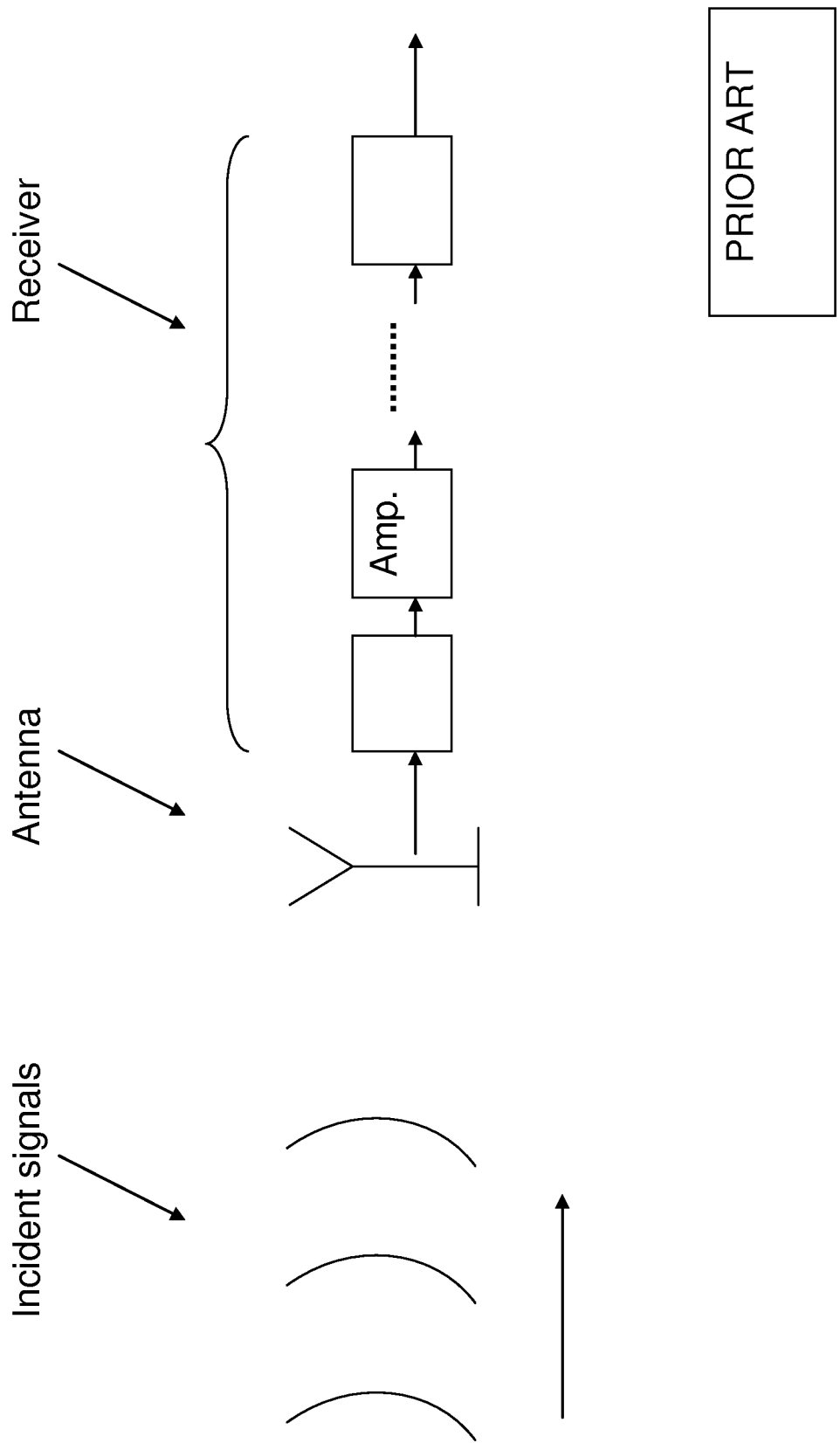
FIG. 1 shows a generalized view of an amplifier in a receiver.

Embodiments of the present invention will be described more fully hereinafter with reference to the accompanying drawings, in which embodiments of the invention are shown. The invention may, however, be embodied in many different forms and should not be construed as being limited to the embodiments set forth herein. Like numbers in the drawings refer to like elements throughout.

The terminology used herein is for the purpose of describing particular embodiments only, and is not intended to limit the invention.

FIG. 1 shows, as background, the use of an amplifier in a general receiver: incident signals arrive at a receiver, suitably by means of an antenna, and are then processed in the receiver. The incident signals can be of many kinds, e.g. acoustic signals, optical signals or electromagnetic signals. Common to all these types of signals is that they may need to be amplified in the receiver, and for this reason, the receiver will usually comprise an amplifier. The receiver usually also comprises a number of other components, as symbolized by boxes and a dashed line surrounding the amplifier, intended to show that an amplifier is usually only one of a number of components in a receiver.

A desire regarding the function of an amplifier, regardless of the type of signals, is that the receiver has a linear function, i.e. that the relationship between input and output values of the amplifier is a linear one, regardless of the amplification factor.

Figure 2:
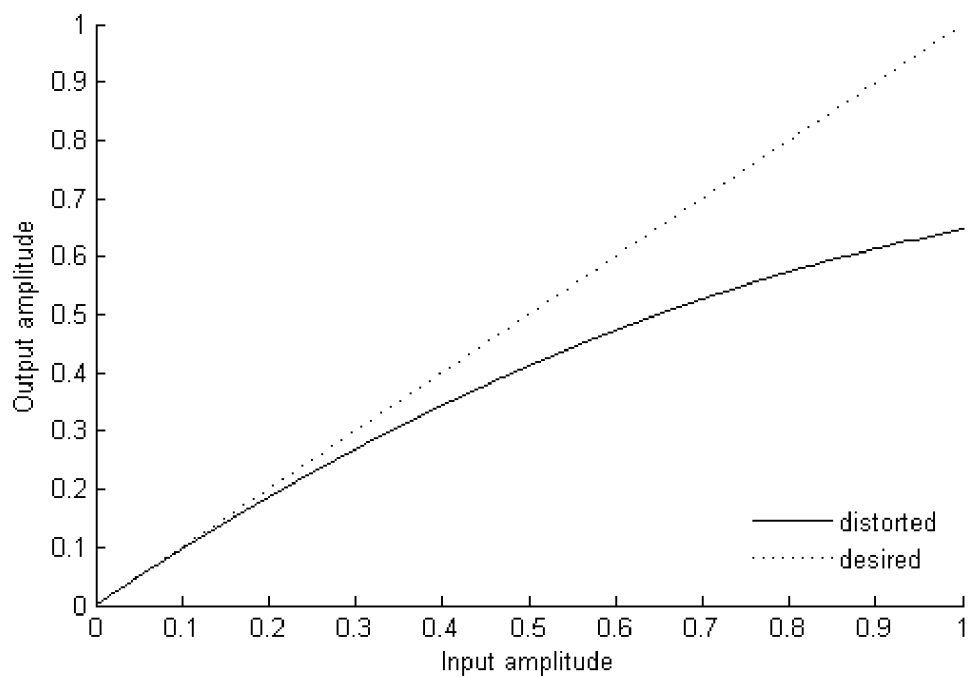
FIG. 2 shows graphs of distorted and desired amplitude outputs of an amplifier.

FIG. 2 shows two amplifier functions: one of the functions, which is shown by means of a dashed line, is the desired relationship between the input and amplitude values of an amplifier, i.e. an input-output graph of an ideal amplifier, and the graph is therefore a straight line, i.e. a linear function. The other function, shown by means of a solid line, is the actual behavior of most amplifiers, and as can be seen in FIG. 2, this line does not show a linear relationship between the input and output amplitude values of the amplifier.

It is naturally a desire to be able to correct the behavior of a non-linear amplifier so that the amplifier has a linear behavior regarding the amplitude input-output function. According to the disclosure herein, the amplitude correction of a non-linear amplifier, i.e. the "linearization", is carried out by means of utilizing the statistical properties of the non-linearity of the amplifier. It should be pointed out that a number of various statistical properties can be utilized for this purpose, but the statistical properties that will be used to show the principle involved is the density function, both the probability density function and the corresponding cumulative density function.

Figure 3:
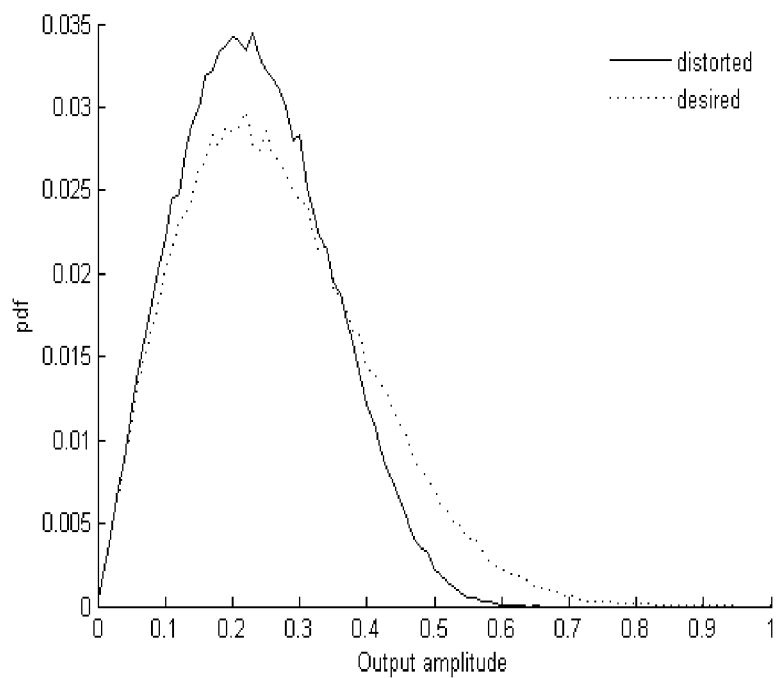
FIG. 3 shows the probability density functions of the graphs of FIG. 2.

Thus, FIG. 3 shows the probability density function, the pdf, of the desired and actual amplitudes shown in FIG. 2, by means of the same dashed and solid lines as in FIG. 2, i.e. the dashed line in FIG. 3 shows the pdf of the desired amplitude output values from an amplifier, and the solid line shows the pdf of the actual amplitude output values from the same amplifier. As can be seen from FIG. 3, the pdf of the amplitude of the actual, i.e. "distorted", signal increases at the point corresponding to the point where (with reference to FIG. 2) the distortion in output amplitude begins, i.e. where the two lines in FIG. 2, dashed and solid, begin to diverge. As can also be seen in FIG. 3, the "tail", i.e. the end part (i.e. starting from an output amplitude value of about 0.35) of the pdf of the amplitude of the distorted signal decreases sharper than the pdf of the desired output amplitudes. This behavior of the pdf of the amplitude of the distorted signal can be seen as an irregularity, and can be explained by the non-linearity of the amplifier, said non-linearity being shown in FIG. 2, where we see that the actual amplitude "drops" within the distortion region as compared to the desired amplitude values.

Figure 4:
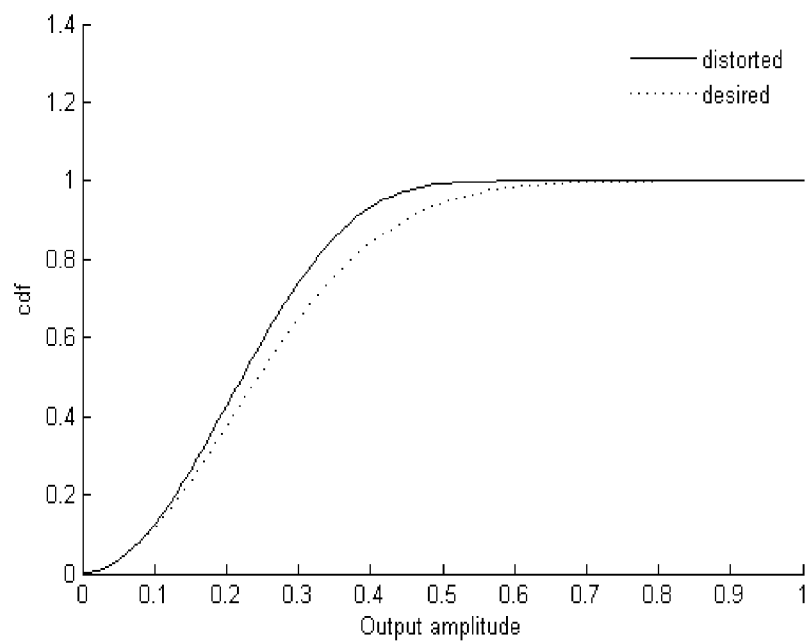
FIG. 4 shows the cumulative density functions of the graphs of FIG. 2.

The above described irregularity in the pdf of the amplitude of the amplifier's output signals is also reflected in a mismatch which can be seen in a comparison between the cumulative density function, the "cdf", of the distorted and the desired signals. These two cdf graphs are shown in FIG. 4, by means of the same kind of lines, i.e. dashed and solid, as were used in FIGS. 2 and 3. The mismatch mentioned above can be seen in FIG. 4 from the beginning of the region of distorted output amplitude values, where the distorted values exhibit a larger cdf than the desired values.

Having seen that the nonlinearity of an amplifier's actual, i.e. "distorted", amplitude output values can be recognized by comparing the cdf of the "distorted" values to the cdf of the amplifiers desired output values, this knowledge can now be used in order to "linearize" an amplifier, i.e. to bring the actual output values of the amplifier closer to, or to actually coincide with, the desired values.

Figure 5:
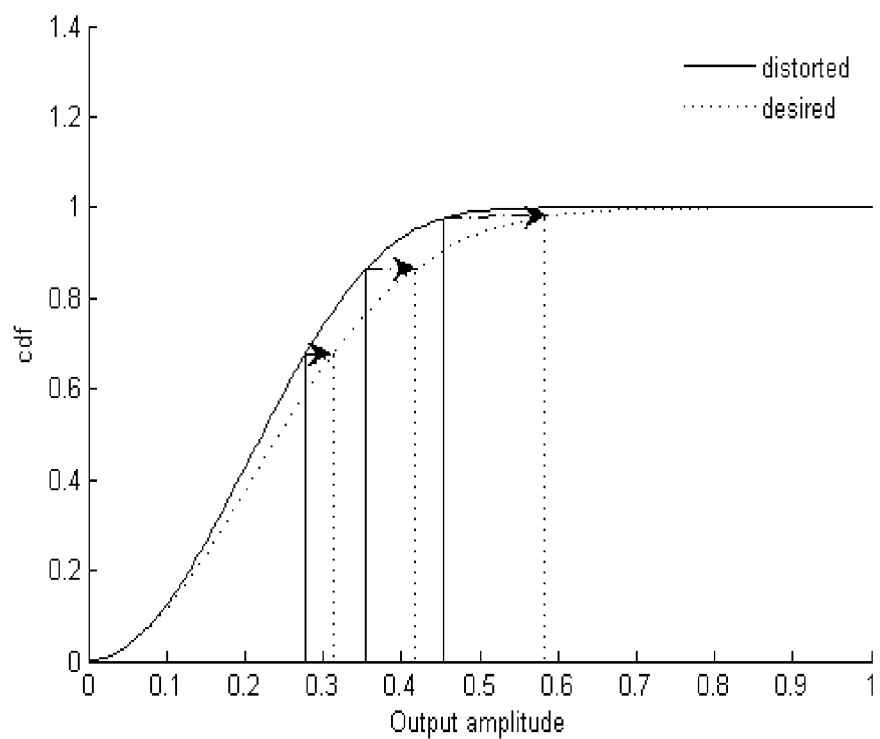
FIG. 5 shows a principle for linearization of the amplitude outputs of an amplifier.

With renewed reference to FIG. 4, the linearization of an amplifier's output values can be obtained by means of "mapping" values of the distorted cdf graph to the desired cdf graph. In other words, a distorted output amplifier value will be replaced by a desired output amplitude value which has the same cdf value. This is shown by means of arrows between the dashed and solid lines in FIG. 5: FIG. 5 shows the same two cdf graphs as FIG. 4, but also shows how the replacement of output amplitudes is carried out. As is shown by, for example, an output amplitude value of slightly less than 0.3, the cdf of the distorted value is found at a point slightly above 0.6. Moving horizontally between the cdf curves, i.e. remaining at the cdf value which is slightly above 0.6, we find that the same cdf value is shared by a desired output amplitude value of slightly above 0.3, and this value is then used in order to replace the distorted output amplitude value of slightly less than 0.3. The linearization of the amplifier's output amplitude can thus be brought about by replacing distorted output amplitude values with desired output amplitude values which have the same cdf value, as is further shown by means of two other "output amplitude value pairs", which are shown by means of arrows in FIG. 5. If this substitution of amplitude values is carried out consistently within the distorted region, the desired amplitude linearization will be obtained. If, for a distorted output amplitude value, a desired output amplitude value which has the same cdf value cannot be found, the desired output amplitude value which has the closest cdf value should be used.

The desired cdf function can be found by a receiver in a number of ways, but in one embodiment, in which the received signals are modulated, the receiver can determine the desired cdf (or another statistical function which is used) by means of knowing the modulation type that has been applied to the received signals.

The substitution of amplitude values, which can also be seen as a one-to one "mapping" from distorted to desired amplitude output values which share the same cdf value, can for example be accomplished by means of a polynomial function. An example of such a polynomial is the following polynomial:

$$x_{DE}(y) = \sum_{p=1}^{P} \theta_p x_{DI}(y) |x_{DI}^{p-1}(y)|,$$

where:

$x_{DE}(y)$ is the amplitude value with value y of the desired cdf, $x_{DI}(y)$ is the amplitude value of the output signals which will be replaced by $X_{DE}(y)$)

$\theta_p$ is a weighting coefficient, and

P is the polynomial order.

Suitably, the weighting coefficient $\theta_p$ is a real value, i.e. non-imaginary, value in order to prevent changes to the phase information. The coefficients $\theta_p$ can, for example, be estimated by means of the least square approach in the following manner, where bold script is used to symbolize factors which are vectors or matrixes, as opposed to scalars:

$$\theta = (A^T A)^{-1} \cdot A^T \cdot x_{DE}(y)$$

where A is a matrix which can be written as:

$$A = [x_{DI}(y) | x_{DI}^2(y) |^T x_{DI}(y) \ldots | x_{DI}^{P-1}(y) |^T x_{DI}(y) \ldots ]$$

where $A^T$ is the transpose of the matrix A.

As can be seen, in the matrix A, $x_{DI}(y)$ is the first vector element in the matrix, $|x_{DI}^2(y)|^T x_{DI}(y)$ is the second vector element in the matrix, and $|x_{DI}^{P-1}(y)|^T x_{DI}(y)$ is the final vector element in the matrix.

Figure 6:
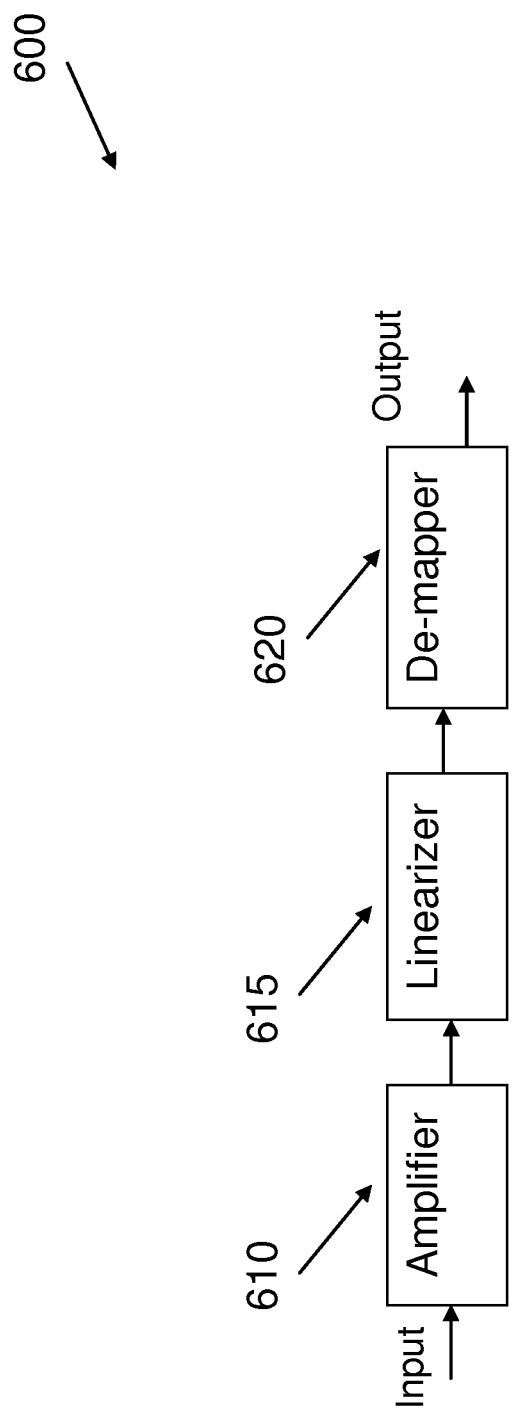
FIG. 6 shows a principle of a receiver with an amplifier amplitude linearizer.

It can be noted that the vector y here refers to a limited set of cdf values ranging from 0 to 1. With $\theta$ estimated, the polynomial for $x_{DE}(y)$ will be completely known can thus be used in order to linearize the amplitude of the output values from the amplifier FIG. 6 shows a schematic block diagram of an embodiment of a receiver 600 in which the principle for linearization which has been explained above is utilized: the receiver 600 comprises an amplifier 610 which is arranged to receive input signals, e.g. from an antenna in the receiver 600, and to output amplified signals. The receiver 600 also comprises a linearizer 615, which is arranged to use the principle explained above, i.e. to determine the cdf of the output values from the amplifier 610 and to also determine a desired cdf for the output values of a the amplifier 610. Having determined the two cdf:s (i.e. those of the distorted and desired output values), the linearizer 615 then carries out the substitution explained above in connection with FIG. 5, i.e. an actual (i.e. distorted) output value $x_{DI}(y)$ from the amplifier 610 is replaced with an output value $x_{DE}(y)$ estimated by the polynomial shown above, i.e. the polynomial $x_{DE}(y) = \Sigma_{p=1}^{P} \theta_p x_{DI}(y) |x_{DI}^{P-1}(y)|$, where $x_{DE}(y)$ has the same cdf value in the desired cdf function as the actual/distorted output value $x_{DI}(y)$ has in "its" cdf. As mentioned previously, if a "pair" of $x_{DI}(y)$ and $x_{DE}(y)$ which have one and the same cdf value cannot be found, the value for $x_{DE}(y)$ whose cdf value is the closest to that of $x_{DI}(y)$ will be used.

It should be mentioned that a receiver such as the one 600 may comprise more units than those shown in FIG. 6 (the same also holds true for the receiver 700 shown in FIG. 7, which will be described below), and that such additional units may be arranged between the linearizer and the de-mapper unit. Examples of such units include an equalizer (e.g., equalizer 625) arranged to receive the output values of the linearizer, and a carrier recovery unit (e.g., carrier recovery unit 630) arranged to receive the output values of the equalizer. Very briefly, and as background information, such units would have the following functions: an equalizer (e.g., equalizer 625) is a component which acts as a band-pass filter, and which boosts the contents inside a defined frequency band, and attenuates both the high and low frequency components outside of this band. An equalizer is usually used in order to overcome losses caused in a transmission channel. A carrier recovery unit (e.g., carrier recovery unit 630) is a component which is used to estimate and compensate for frequency and phase differences between a received signal's carrier wave and local oscillator in a receiver, for the purpose of coherent demodulation.

As can be seen in FIG. 6, the receiver 600 also comprises a de-mapper unit 620 arranged to receive the output values of the linearizer 615 The function of the de-mapper unit 620 can be described briefly as follows: a de-mapper unit, also sometimes referred to as a constellation de-mapper, is arranged to translate ("de-map") k-bit binary symbols from a signal space of $\leq 2^k$ points.

So far, the linearization which has been described has dealt with the linearization of the amplitude values which are output from the amplifier 610. However, an amplifier such as the amplifier 610 can also introduce non-linearities in the phase values of the output values, and thus, a receiver which comprises such an amplifier may also need to be arranged to perform phase linearization. In a receiver such as the one 600 shown in FIG. 6: the receiver can, for example, be arranged to measure the receiver bit error rate, BER, of the output values from the de-mapper unit 620, and to correct the phase of the output values from the amplifier if this BER falls below a predetermined threshold.

The BER can, for example, be measured in the de-mapper unit 620, which can then also be arranged to assist in the receiver's correction of phase errors in the output values from the amplifier. When describing an embodiment of how the correction of phase errors can be performed in a receiver such as the one 600, the following observations can be made: the non-linearity in phase in output values from an amplifier such as the one 610 depends on the amplitude of the corresponding input value to the amplifier in a manner which can suitably be modelled by means of an n-th order polynomial. In the embodiment which will be described here, a second order polynomial, i.e. n=2, will be used in order to describe this modelling, said polynomial being:

$$\phi(n) = \Sigma_{k=1}^{2} \beta_k |x_{out\_lin}(n)|^k, \quad [1]$$

Where:

$\phi(n)$ is the nonlinear phase distortion at the output of the amplifier, and $x_{out\_lin}(n)$ is the linearized amplitude value at time instant n, and $\beta_k$ is a weighting coefficient.

Suitably, the weighting coefficient $\beta_k$, i.e. in the equation above $\beta_1$ and $\beta_2$, at time instant l can be found by:

$$\begin{bmatrix} \beta_1(l) \\ \beta_2(l) \end{bmatrix} = \begin{bmatrix} \beta_1(l-1) \\ \beta_2(l-1) \end{bmatrix} + \mu \cdot \phi(e(l)) \cdot \begin{bmatrix} x_{in}(l) \\ x_{in}^{(2)}(l) \end{bmatrix}, \quad [2]$$

Where:

e(l) is the symbol error corresponding to the output values from the amplifier 610 when they reach the de-mapper unit 620 and are de-mapped to a symbol at time instant l. Since the symbols are complex values, e(l) is also a complex value, $\phi$ is the phase of e(l), and represents the phase error in the de-mapper unit at time instant l, $\mu$ is a step size ranging from 0 to 1, and $x_{in}(l)$ is the input signal to the de-mapper unit at time instant l.

It should be noted that in equation [1] above, the letter n has been used to denote a discrete instant in time, while in equation [2] above, the letter l has been used to denote a discrete instant in time. This is intentional, and is due to the fact that the discrete time instants l and n may differ, due to differing sampling rates in, for example, the amplifier 610 and the de-mapper unit 620.

As can be seen from equations [1] and [2] above, if both $\beta_1$ and $\beta_2$ are known, the phase rotation error can be estimated and compensated for, e.g. by the same linearizer 615 as is used for linearizing the amplitude values. Thus, the de-mapper unit 620, or another unit connected to the output of the de-mapper unit 620, is arranged to measure the phase error $\phi(e(l))$ in the output values from the amplifier 610 when they reach the de-mapper unit 620 and are de-mapped to corresponding symbols at time instant l, and to use this phase error in order to determine $\beta_1$ and $\beta_2$ by means of equation [2], and to feed $\beta_1$ and $\beta_2$ to the linearizer 615, which is then arranged to use equation [1] in order to accomplish the phase linearization. As stated, the phase linearization can be performed by a unit which is separate from the unit which linearizes the amplitude values from the amplifier, or in the same unit.

Figure 7:
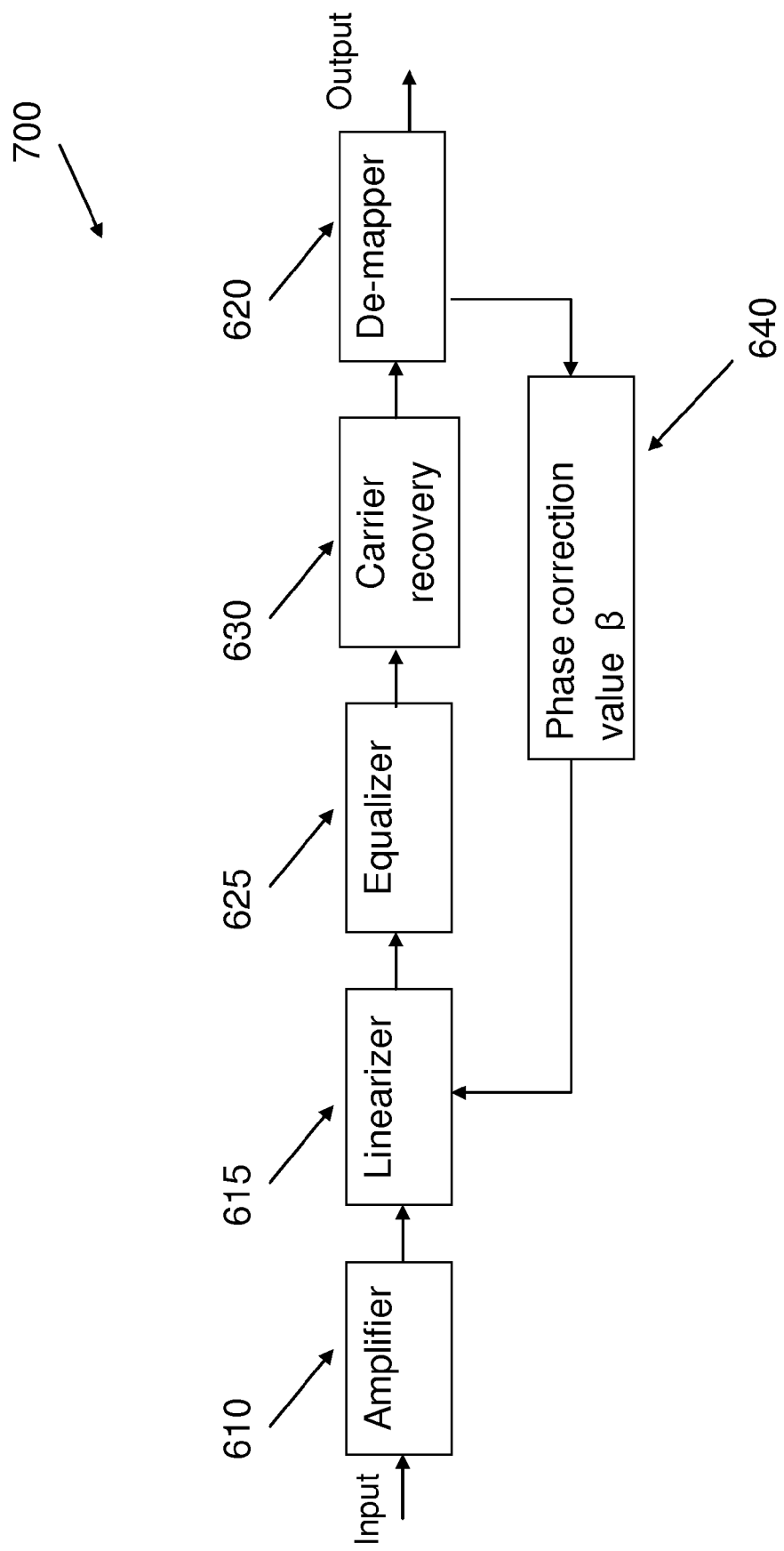
FIG. 7 shows a more detailed receiver with an amplifier amplitude and phase linearizer.

FIG. 7 shows an embodiment of a receiver 700 which comprises the blocks of the receiver 600 of FIG. 6, but which also comprises a feedback unit 640, which is arranged to feed the values of $\beta_1$ and $\beta_2$ to the linearizer 615, with the linearizer 615 being arranged to use them in the manner described above, i.e. according to equation [1], in order to accomplish the phase linearization. As pointed out, the linearization of the phase could also take place in a unit separate from the unit which performs the amplitude linearization, in which case the feedback unit 640 would be arranged to feed the values of $\beta_1$ and $\beta_2$ to that unit instead.

In the drawings and specification, there have been disclosed exemplary embodiments of the invention. However, many variations and modifications can be made to these embodiments without substantially departing from the principles of the present invention. Accordingly, although specific terms are employed, they are used in a generic and descriptive sense only and not for purposes of limitation.

The invention is not limited to the examples of embodiments described above and shown in the drawings, but may be freely varied within the scope of the appended claims.

The invention claimed is:

1. A receiver for signals, said receiver comprising:
an amplifier which is arranged to receive and amplify the signals received by the receiver,
a linearizer arranged to linearize the amplitude values of the output signals from the amplifier,
wherein the linearizer is arranged to perform said linearizing by determining actual and desired values of a cumulative density function, CDF, for the amplitude values of the output signals from the amplifier and replacing the actual amplitude values of the output signals from the amplifier with the desired amplitude values of the output signals from the amplifier, wherein each desired amplitude value replaces a corresponding actual amplitude value having the same CDF value.

2. The receiver of claim 1, in which the signals are modulated, the receiver being arranged to determine a desired CDF by knowing which modulation type has been applied to the received signals.

3. The receiver of claim 1, in which the replacement of the amplitude values of the output signals from the amplifier is based on a polynomial function.

4. The receiver of claim 3, in which the polynomial function is $x_{DE}(y)=\Sigma_{p=1}^{P}\theta_p x_{DI}(y)|x_{DI}^{P-1}(y)|$, where $x_{DE}(y)$ is the amplitude value with value y of said CDF and $x_{DI}(y)$ is the amplitude value of the output signals which are be replaced by $x_{DE}(y)$, $\theta_p$ is a weighting coefficient and P is the polynomial order.

5. The receiver of claim 1 further comprising a de-mapper unit for the output signals from the amplifier, the receiver being arranged to measure a bit error rate, BER, of the output signals from the de-mapper unit, and to correct the phase of the output signals from the amplifier if the BER falls below a predetermined threshold, the receiver being arranged to perform the phase correction by compensating for a phase error of the output signals from the amplifier by using the polynomial $$\phi(n)=\Sigma_{k=1}^{2}\beta_k|x_{out\_lin}(n)|^k,$$

where $\phi(n)$ is a phase error at the output of the amplifier, $x_{out\_lin}$ is the linearized amplitude corresponding to the signal at the input to the amplifier at time instant n, and $\beta_k$ is a weighting coefficient.

6. The receiver of claim 5, in which the weighting coefficient $\beta_k$ at time instant l is found by:

$$\begin{bmatrix}\beta_1(l)\\\beta_2(l)\end{bmatrix}=\begin{bmatrix}\beta_1(l-1)\\\beta_2(l-1)\end{bmatrix}+\mu\cdot\phi(e(l))\cdot\begin{bmatrix}|x_{in}(l)|\\|x_{in}^{(2)}(l)|\end{bmatrix},$$

where
e(l) is a complex symbol error corresponding to the output signals from the amplifier when they reach the de-mapper unit and are de-mapped to a symbol at time instant l,
$\phi$ is a phase of e(l) and represents a phase error in the de-mapper unit at time instant l,
$\mu$ is a step size ranging from 0 to 1, and
$x_{in}(l)$ is an input signal to the de-mapper unit at time instant l.

* * * * *